(12) United States Patent
Rhoden et al.

(10) Patent No.: US 11,873,073 B2
(45) Date of Patent: Jan. 16, 2024

(54) FUEL COOLED MULTI-FUNCTION APERTURE

(71) Applicant: Hamilton Sundstrand Corporation, Charlotte, NC (US)

(72) Inventors: William E. Rhoden, Fernandina Beach, FL (US); Anders Walker, Marion, IA (US); David Cripe, Mount Vernon, IA (US); Ross Keith Wilcoxon, Cedar Rapids, IA (US); Jeremiah Wolf, Atkins, IA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 328 days.

(21) Appl. No.: 17/186,519

(22) Filed: Feb. 26, 2021

(65) Prior Publication Data

US 2021/0300520 A1  Sep. 30, 2021

Related U.S. Application Data

(60) Provisional application No. 63/000,121, filed on Mar. 26, 2020.

(51) Int. Cl.
  *B64C 1/38* (2006.01)
  *F28D 1/02* (2006.01)
(52) U.S. Cl.
  CPC .............. *B64C 1/38* (2013.01); *F28D 1/0233* (2013.01); *F28F 2280/00* (2013.01)
(58) Field of Classification Search
  CPC .. H01Q 1/02; H01M 10/6556; F28F 2280/00; F28D 1/0233; B64C 1/38
  See application file for complete search history.

(56) References Cited

U.S. PATENT DOCUMENTS

| | | | |
|---|---|---|---|
| 3,865,183 A | 2/1975 | Roush | |
| 8,537,059 B2* | 9/2013 | Sauer | H01Q 1/02 |
| | | | 343/705 |
| 9,116,222 B1* | 8/2015 | Ellsworth | H01Q 1/02 |
| 9,629,280 B2 | 4/2017 | Johnson | |
| 10,041,745 B2 | 8/2018 | Poltorak | |
| 10,506,736 B2* | 12/2019 | Zheng | H05K 7/20163 |
| 10,547,117 B1* | 1/2020 | Tomasic | H01Q 15/24 |
| 2006/0090489 A1* | 5/2006 | Haws | H05K 7/20309 |
| | | | 62/176.6 |
| 2011/0267776 A1* | 11/2011 | Porreca | H05K 7/1404 |
| | | | 361/720 |
| 2016/0029514 A1 | 1/2016 | Alakoc et al. | |
| 2018/0155046 A1* | 6/2018 | Bowman | B64D 37/34 |

(Continued)

OTHER PUBLICATIONS

Extended European Search Report for EP Application No. 21158532.8, dated Aug. 6, 2021, pp. 10.

*Primary Examiner* — Devon Russell
(74) *Attorney, Agent, or Firm* — Kinney & Lange, P. A.

(57) ABSTRACT

Phased array antennas, such as a multi-function aperture, are limited in performance and reliability by traditional air-cooled thermal management systems. A fuel-cooled multi-function aperture passes engine fuel through heat exchangers that surround the multi-function aperture to provide better heat transfer than can be achieved through air cooling systems. The increased heat transfer and thermal management results in a multi-function aperture with improved performance and reliability.

19 Claims, 6 Drawing Sheets

(56) References Cited

U.S. PATENT DOCUMENTS

2019/0181516 A1* 6/2019 Seki .................. H01M 10/625
2019/0182991 A1  6/2019 Muthu et al.
2020/0003497 A1  1/2020 Aston et al.

* cited by examiner

FUEL COOLED MULTI-FUNCTION APERTURE

CROSS-REFERENCE TO RELATED APPLICATION(S)

This application claims the benefit of U.S. Provisional Application No. 63/000,121 filed Mar. 26, 2020 for "FUEL COOLED MULTI-FUNCTION APERTURE" by W. E. Rhoden, A. Walker, D. Cripe, R. K. Wilcoxon and J. Wolf.

BACKGROUND

The present disclosure relates to liquid cooling systems, and in particular, to a fuel cooled system for a phased array antenna.

Many aircraft are equipped with on-board air-cooling systems configured to cool various electronic components on the aircraft, such as the aircraft's radar system. The air-cooling systems route air through channels within the aircraft to the hot electronic components that require cooling. The cool air absorbs heat from the various electronic components and then transfers the heated air to another system within the aircraft or exhausts the heated air from the aircraft. Air-cooling systems are limited by the heat transfer coefficient and mass flow rate of the air and are not suitable for all cooling applications. Some electronic components, such as phased array antennas, benefit from a liquid cooling system because liquid coolant is particularly effective in absorbing heat due to its high heat transfer coefficient, density, and specific heat, as compared to air. Effective thermal management improves performance and reliability of the electronic components and can be critical to the success of the system.

A multi-function aperture is a type of phased array antenna that is configured to transmit and receive a plurality of radar and communication signals. A phased array antenna consolidates a plurality of individual antennas into a single wideband design, resulting in a more efficient system. Phased array antennas, such as the multi-function aperture, can be used for many different applications, such as radar, electronic attack, directional communications, and electronic intelligence, among other applications. Previous applications of the multi-function aperture utilize air-cooled systems, limiting the performance and reliability of the multi-function aperture. Future multi-function aperture designs challenge the limits of air-cooled thermal management systems. Therefore, the multi-function aperture requires increased cooling and thermal management to achieve improved performance and reliability.

SUMMARY

In one example, a fuel-cooled multi-function aperture includes a multi-function aperture and at least one heat exchanger attached to and positioned adjacent to the multi-function aperture. The multi-function aperture includes a plurality of circuit card modules, wherein each of the plurality of circuit card modules is positioned adjacent to at least one of the plurality of circuit card modules in a stacked configuration. The at least one heat exchanger includes an inlet, an outlet, and a plurality of channels extending between the inlet and the outlet. Further, the at least one heat exchanger is configured to receive fuel through the inlet, flow the fuel through the plurality of channels, and dispense the fuel through the outlet.

DETAILED DESCRIPTION

Figure 1:
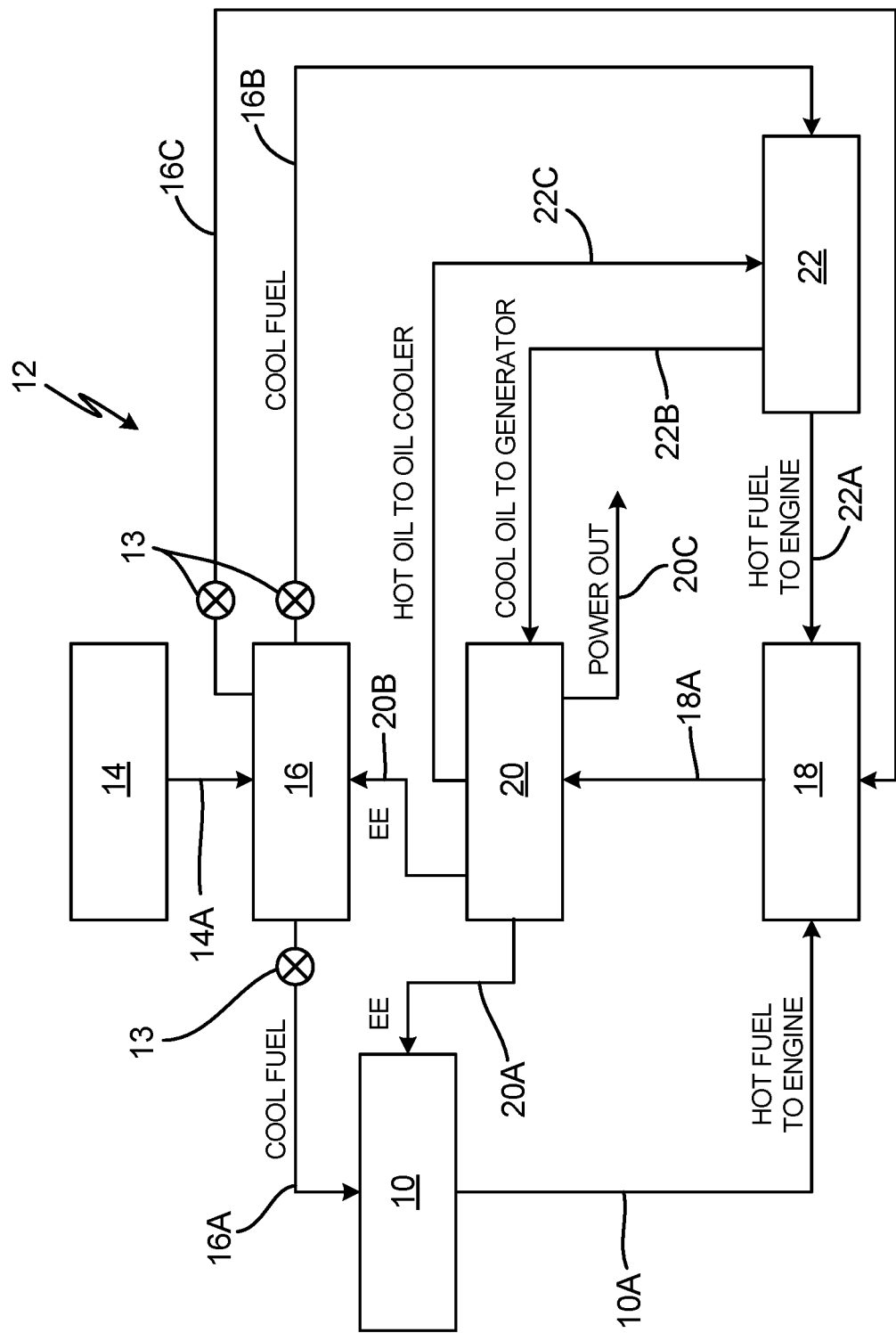
FIG. 1 is a schematic view of a fuel-cooled multi-function aperture in an engine system.

FIG. 1 is a schematic view of fuel-cooled multi-function aperture 10 in engine system 12. Engine system 12 includes fuel-cooled multi-function aperture (FCMFA) 10, fuel tank 14, fluid pump 16, engine 18, generator 20, and oil cooler 22. Fuel tank 14 is fluidly connected through conduit 14A to fluid pump 16. Fluid pump 16 is fluidly connected through conduit 16A to FCMFA 10 and fluidly connected through conduit 16B to oiler cooler 22. FCMFA 10 is fluidly connected through conduit 10A to engine 18. Oil cooler 22 is fluidly connected through conduit 22A to engine 18 and fluidly connected through conduit 22B and conduit 22C to generator 20. Engine 18 is mechanically connected through connection 18A to generator 20. Generator 20 is electrically connected through electrical connection 20A to FCMFA 10 and electrically connected through electrical connection 20B to fluid pump 16. Further, generator 20 is electrically connected through electrical connection 20C to other components to provide electric power to the other components.

Fuel tank 14 is a fluid vessel that can store fuel for use in engine 18. The fuel within fuel tank 14 can be a liquid fuel that is capable of combustion in engine 18. Engine 18 can be an internal combustion engine or a gas turbine engine. Fluid pump 16 is configured to force the fuel within fuel tank 14 through conduit 16A to FCMFA 10. The cool fuel that reaches FCMFA 10 flows through FCMFA 10 to remove heat from FCMFA 10, as will be discussed in detail below. The cool fuel that flows through FCMFA 10 absorbs and removes heat from FCMFA 10 and dispenses from FCMFA 10 as heated fuel. The heated fuel flows through conduit 10A to engine 18 where the fuel is combusted and turned into rotational energy. A portion of the rotational energy created by engine 18 is transferred through connection 18A to generator 20. Generator 20 converts the rotational energy into electrical energy (EE) and the electrical energy is supplied to FCMFA 10 and fluid pump 16 to provide electrical power to both components.

Fluid pump 16 is also configured to force the fuel from fuel tank 14 through conduit 16B to oil cooler 22. Operation of generator 20 creates hot oil that is dispensed by a pump (not shown) from generator 20 through conduit 22C to oil cooler 22. Heat exchangers (not shown) within oil cooler 22 transfer heat from the hot oil to the cool fuel received from fuel tank 14. The heated fuel then flows through conduit 22A to engine 18 where the fuel is combusted and turned into rotational energy. Removing heat from the hot oil produces cooled oil, which then flows through conduit 22B to generator 20 for use within generator 20. Engine system 12 uses heat exchangers to pre-heat the fuel before combustion in engine 18, which results in a more efficient engine 18 with less wasted energy. Further, removing heat from FCMFA 10 and generator 20 provides the advantages of improved performance and reliability of both FCMFA 10 and generator 20. Engine system 12 also includes conduit 16C which extends between fluid pump 16 and engine 18, conduit 16C is a bypass which provides fuel directly to engine 18 from fuel tank 14. Valves 13 are installed on or in conduit 16A, conduit 16B, and conduit 16C and valves 13 are configured to actively control the flow rate through each conduit 16A, 16B, and 16C. Further, engine system 12 includes a controller (not shown) used to control all commands and operational functions of engine system 12.

Figure 2A:
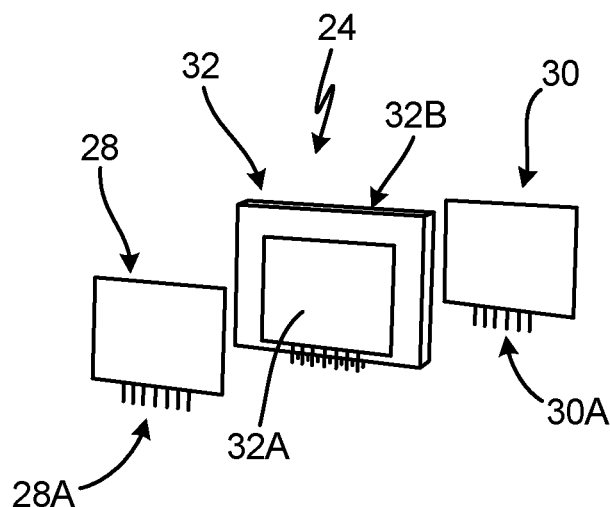
FIG. 2A is a perspective view of a circuit card module in an exploded configuration.
Figure 2B:
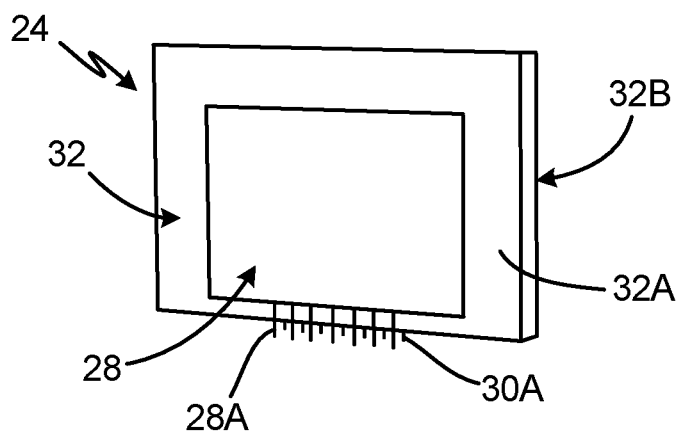
FIG. 2B is a perspective view of the circuit card module in an assembled configuration.
Figure 2C:
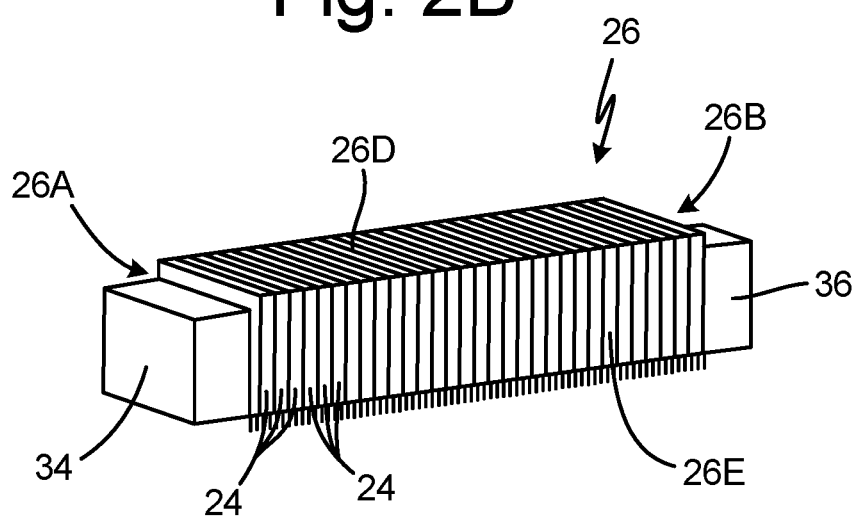
FIG. 2C is a perspective view of a multi-function aperture.

FIG. 2A is a perspective view of circuit card module 24 in an exploded configuration. FIG. 2B is a perspective view of circuit card module 24 in an assembled configuration. FIG. 2C is a perspective view of multi-function aperture (MFA) 26. FIGS. 2A-2C will be discussed together. Circuit card module 24 includes first circuit card 28, second circuit card 30, and rib 32. First circuit card 28 includes electrical pins 28A, in one or more electrical connectors, all extending from one side of first circuit card 28, in which all electrical pins 28A are parallel with one another. Second circuit card 30 includes electrical pins 30A all extending from one side of second circuit card 30, in which all electrical pins 30A are parallel with one another. In the embodiment shown, first circuit card 28 and second circuit card 30 each include eight electrical pins 28A and 30A, respectively. In another embodiment, first circuit card 28 and second circuit card 30 can each include more than or less than eight electrical pins.

First circuit card 28 is attached to first side 32A of rib 32 and second circuit card 30 is attached to second side 32B of rib 32, opposite first side 32A of rib 32. In other words, rib 32 is positioned between and attached to both first circuit card 28 and second circuit card 30. When first circuit card 28 and second circuit card 30 are attached to and installed on first side 32A and second side 32B, respectively, of rib 32, electrical pins 28A of first circuit card 28 and electrical pins 30A of second circuit card 30 are parallel with each other. The installation of first circuit card 28 and second circuit card 30 on rib 32 creates circuit card module 24. Circuit card module 24 is configured to transmit and receive radar, communication, and other signals.

MFA 26 is a phased array antenna configured to transmit and receive a plurality of radar, communication, and other signals. MFA 26 includes a plurality of circuit card modules 24, first control circuit 34, and second control circuit 36. Each of the plurality of circuit card modules 24 is positioned adjacent to at least one of the plurality of circuit card modules. More specifically, the two end circuit card modules 24 are positioned adjacent one other circuit card module 24. In contrast, all the circuit card modules 24 positioned between the two ends are positioned adjacent two other circuit card modules 24. The plurality of circuit card modules 24 are positioned in a stacked configuration, in which each circuit card module 24 is positioned in an organized manner adjacent another circuit card module 24. The plurality of circuit card modules 24 are positioned such that the electrical pins 28A and 30A are all parallel to each other and extending from the same side of their respective circuit card. In the embodiment shown, there are thirty-two circuit card modules 24 creating a 64 by 8 array of pins. In another embodiment, there can be more than or less than thirty-two circuit card modules. First control circuit 34 is positioned adjacent to one of the plurality of circuit card modules 24 at first end 26A of MFA 26. Second control circuit 36 is positioned adjacent to one of the plurality of circuit card modules 24 at second end 26B of MFA 26. First control circuit 34 and second control circuit 36 are configured to control the operation of each individual first circuit card 28 and second circuit card 30. The assembly of the plurality of circuit card modules 24, first control circuit 34, and second control circuit 36 creates MFA 26, which is configured to transmit and receive a plurality of radar, communication, and other signals.

Figure 3A:
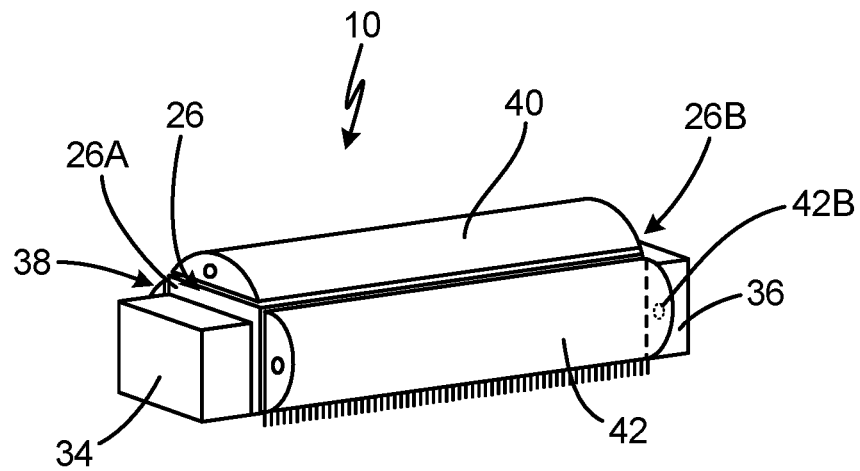
FIG. 3A is a perspective view of a first embodiment of the fuel-cooled multi-function aperture.
Figure 3B:
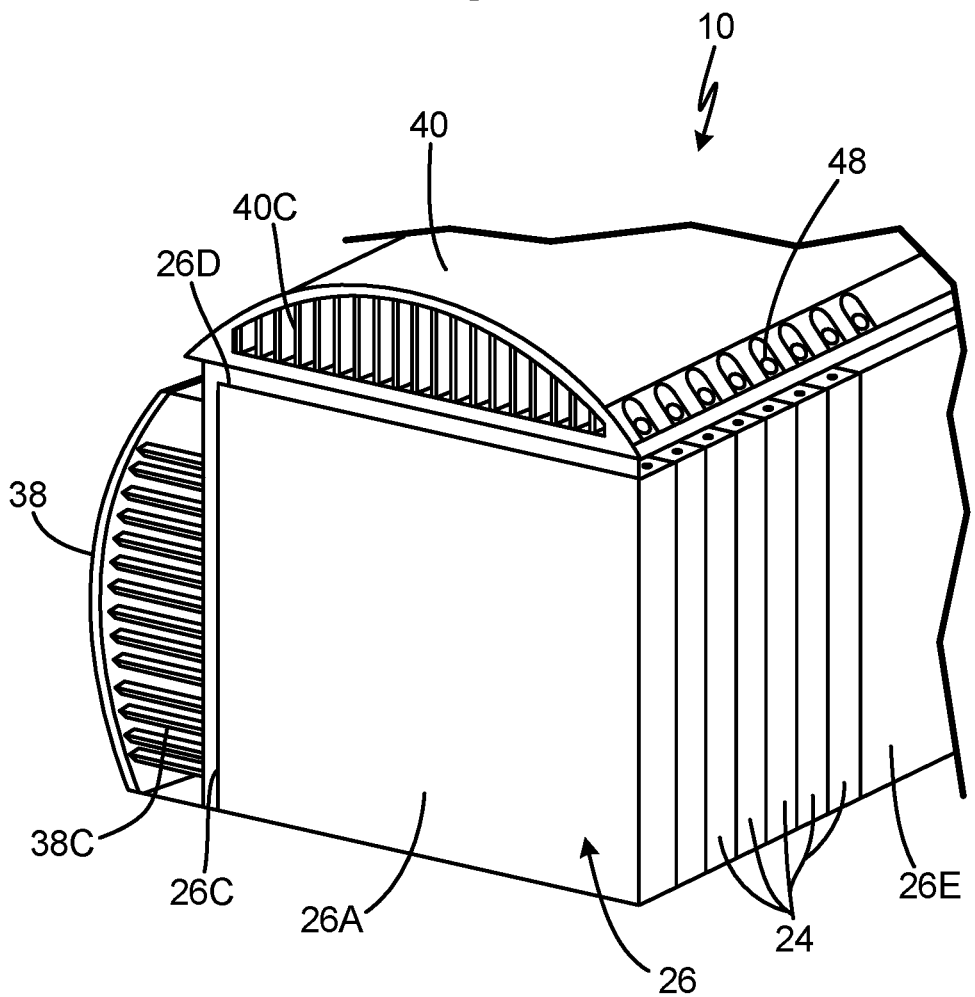
FIG. 3B is a close-up perspective view of a first embodiment of the fuel-cooled multi-function aperture.
Figure 3C:
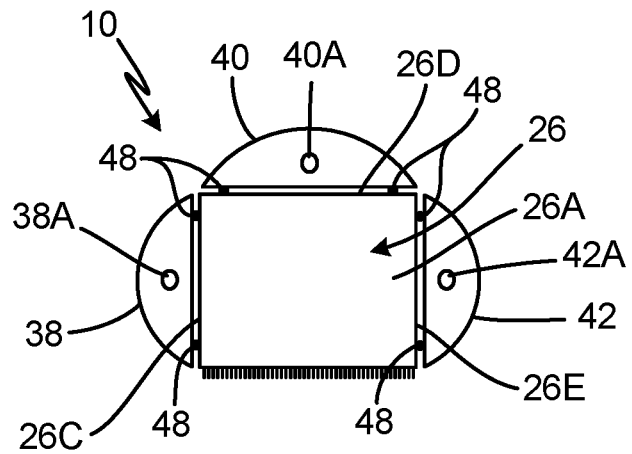
FIG. 3C is a side view of a first embodiment of the fuel-cooled multi-function aperture.
Figure 3D:
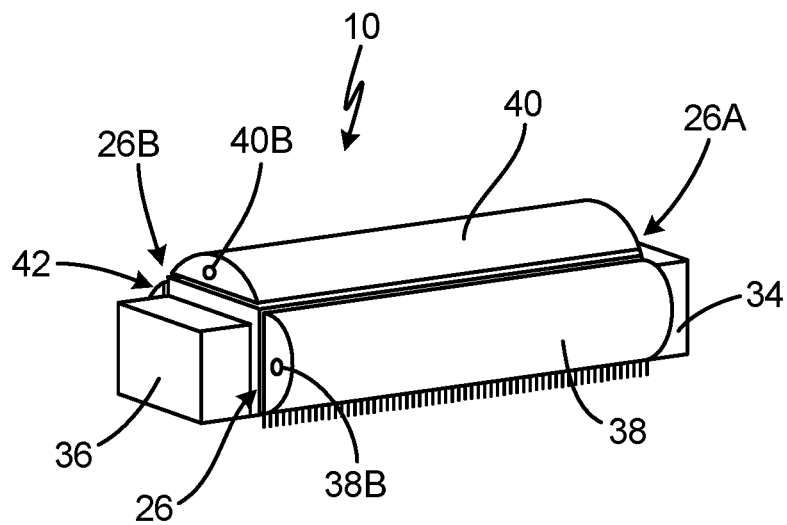
FIG. 3D is a perspective view of a first embodiment of the fuel-cooled multi-function aperture, opposite FIG. 3A.

FIG. 3A is a perspective view of a first embodiment of FCMFA 10. FIG. 3B is a close-up perspective view of the first embodiment of FCMFA 10 with first control circuit 34 removed for clarity. FIG. 3C is a side view of the first embodiment of FCMFA 10. FIG. 3D is a perspective view of a first embodiment of FCMFA 10, opposite FIG. 3A. FIGS. 3A-3D will be discussed together. FCMFA 10 includes MFA 26, first heat exchanger 38, second heat exchanger 40, and third heat exchanger 42. First heat exchanger 38 is positioned on first side 26C of MFA 26, second heat exchanger 40 is positioned on second side 26D of MFA 26, and third heat exchanger 42 is positioned on third side 26E of MFA 26.

First heat exchanger 38 includes first inlet 38A positioned at first end 26A of MFA 26, first outlet 38B positioned at second end 26B of MFA 26, and a plurality of channels 38C extending between first inlet 38A and first outlet 38B. As best shown in FIG. 3C, the outer profile of first heat exchanger 38 is a semi-circle with an outer diameter of ten inches or less. First heat exchanger 38 is a fluidly sealed component with an outer cover and a plurality of channels 38C extending within the sealed outer cover. Each end of first heat exchanger 38 includes a fluidly sealed cover with the exception of first inlet 38A and first outlet 38B. First inlet 38A can be an aperture with a fluid tight fitting suitable for transferring a liquid without leakage. First outlet 38B can be an aperture with a fluid tight fitting suitable for transferring a liquid without leakage. Although the first inlet 38A and first outlet 38B are shown in a specific location, first inlet 38A and first outlet 38B can be positioned anywhere on the ends of first heat exchanger 38.

Channels 38C are made up of a plurality of walls that create individual passages in which liquid can flow through. Channels 38C are configured to create additional surface area in which the maximum amount of heat can be removed from MFA 26. In operation, liquid (e.g. fuel) flows through channels 38C and heat produced by MFA 26 is absorbed by the liquid flowing through channels 38C, removing the heat from MFA 26. In the embodiment shown, a specific number of channels 38C are shown but in another embodiment any number of channels 38C can be used. Further, in the embodiment shown the channels 38C are straight channels. In another embodiment, channels 38C can be any shape that would maximize the surface area and amount of heat that can be removed from MFA 26. First heat exchanger 38 is configured to receive fuel from fuel tank 14 (FIG. 1) through first inlet 38A, flow the fuel through the plurality of channels 38C, and then dispense the fuel through first outlet 38B into a tube that delivers the fuel to engine 18. The fuel that flows through channels 38C absorbs heat produced by MFA 26 and removes the heat from MFA 26, cooling MFA 26 in the process.

First heat exchanger 38 is attached to each and every one of the plurality of circuit card modules 24 through fastener 48 on first side 26C of MFA 26. Attaching first heat exchanger 38 to each circuit card module 24 secures circuit card module 24 in an assembled form creating MFA 26 and also enhances heat transfer from MFA 26 to first heat exchanger 38. First heat exchanger 38 can be a single-piece construction that is manufactured using additive manufacturing technology. First heat exchanger 38 can be constructed from a steel, aluminum, titanium, metal alloy, or a polymer. Additively manufacturing first heat exchanger 38 provides the benefit of allowing first heat exchanger 38 to be a single-piece construction, eliminating abutting components that would require additional sealing components. Therefore, additively manufacturing first heat exchanger 38 eliminates locations for potential leakage. Further, additively manufacturing first heat exchanger 38 allows channels 38C to be complex shapes to create localized turbulences to improve heat transfer and cooling of MFA 26.

Second heat exchanger 40 includes second inlet 40A positioned at first end 26A of MFA 26, second outlet 40B positioned at second end 26B of MFA 26, and a plurality of channels 40C extending between second inlet 40A and second outlet 40B. As best shown in FIG. 3C, the outer profile of second heat exchanger 40 is a semi-circle with an outer diameter of ten inches or less. Second heat exchanger 40 is a fluidly sealed component with an outer cover and a plurality of channels 40C extending within the sealed outer cover. Each end of second heat exchanger 40 includes a fluidly sealed cover with the exception of second inlet 40A and second outlet 40B. Second inlet 40A can be an aperture with a fluid tight fitting suitable for transferring a liquid without leakage. Second outlet 40B can be an aperture with a fluid tight fitting suitable for transferring a liquid without leakage. Although the second inlet 40A and second outlet 40B are shown in a specific location, second inlet 40A and second outlet 40B can be positioned anywhere on the ends of second heat exchanger 40.

Channels 40C are made up of a plurality of walls that create individual passages through which liquid can flow. Channels 40C are configured to create additional surface area from which the maximum amount of heat can be removed from MFA 26. In operation, liquid (e.g. fuel) flows through channels 40C and heat produced by MFA 26 is absorbed by the liquid flowing through channels 40C, removing the heat from MFA 26. In the embodiment shown, a specific number of channels 40C are shown but in another embodiment any number of channels 40C can be used. Further, in the embodiment shown the channels 40C are straight channels. In another embodiment, channels 40C can be any shape that would maximize the surface area and amount of heat that can be removed from MFA 26. Second heat exchanger 40 is configured to receive fuel from fuel tank 14 (FIG. 1) through second inlet 40A, flow the fuel through the plurality of channels 40C, and then dispense the fuel through second outlet 40B into a tube that delivers the fuel to engine 18. The fuel that flows through channels 40C absorbs heat produced by MFA 26 and removes the heat from MFA 26, cooling MFA 26 in the process.

Second heat exchanger 40 is attached to each and every one of the plurality of circuit card modules 24 through fastener 48 on second side 26D of MFA 26. Attaching second heat exchanger 40 to each circuit card module 24 secures circuit card module 24 in an assembled form creating MFA 26 and also enhances heat transfer from MFA 26 to second heat exchanger 40. Second heat exchanger 40 can be a single-piece construction that is manufactured using additive manufacturing technology. Second heat exchanger 40 can be constructed from a steel, aluminum, titanium, metal alloy, or a polymer. Additively manufacturing second heat exchanger 40 provides the benefit of allowing second heat exchanger 40 to be a single-piece construction, eliminating abutting components that would require additional sealing components. Therefore, additively manufacturing second heat exchanger 40 eliminates locations for potential leakage. Further, additively manufacturing second heat exchanger 40 allows channels 40C to be complex shapes to create localized turbulences to optimize heat transfer and cooling of MFA 26.

Third heat exchanger 42 includes third inlet 42A positioned at first end 26A of MFA 26, third outlet 42B positioned at second end 26B of MFA 26, and a plurality of channels 42C extending between third inlet 42A and third outlet 42B. As best shown in FIG. 3C, the outer profile of third heat exchanger 42 is a semi-circle with an outer diameter of ten inches or less. Third heat exchanger 42 is a fluidly sealed component with an outer cover and a plurality of channels 42C extending within the sealed outer cover. Each end of third heat exchanger 42 includes a fluidly sealed cover with the exception of third inlet 42A and third outlet 42B. Third inlet 42A can be an aperture with a fluid tight fitting suitable for transferring a liquid without leakage. Third outlet 42B can be an aperture with a fluid tight fitting suitable for transferring a liquid without leakage. Although the third inlet 42A and third outlet 42B are shown in a specific location, third inlet 42A and third outlet 42B can be positioned anywhere on the ends of third heat exchanger 42.

Channels 42C are made up of a plurality of walls that create individual passages through which liquid can flow. Channels 42C are configured to create additional surface area from which the maximum amount of heat can be removed from MFA 26. In operation, liquid (e.g. fuel) flows through channels 42C and heat produced by MFA 26 is absorbed by the liquid flowing through channels 42C, removing the heat from MFA 26. In the embodiment shown, a specific number of channels 42C are shown but in another embodiment any number of channels 42C can be used. Further, in the embodiment shown the channels 42C are straight channels. In another embodiment, channels 42C can be any shape that would maximize the surface area and amount of heat that can be removed from MFA 26. Third heat exchanger 42 is configured to receive fuel from fuel tank 14 (FIG. 1) through third inlet 42A, flow the fuel through the plurality of channels 42C, and then dispense the fuel through third outlet 42B into a tube that delivers the fuel to engine 18. The fuel that flows through channels 42C absorbs heat produced by MFA 26 and removes the heat from MFA 26, cooling MFA 26 in the process.

Third heat exchanger 42 is attached to each and every one of the plurality of circuit card modules 24 through fastener 48 on third side 26E of MFA 26. Attaching third heat exchanger 42 to each circuit card module 24 secures circuit card module 24 in an assembled form creating MFA 26 and also enhances heat transfer from MFA 26 to third heat exchanger 42. Third heat exchanger 42 can be a single-piece construction that is manufactured using additive manufacturing technology. Third heat exchanger 42 can be constructed from a steel, aluminum, titanium, metal alloy, or a polymer. Additively manufacturing third heat exchanger 42 provides the benefit of allowing third heat exchanger 42 to be a single-piece construction, eliminating abutting components that would require additional sealing components. Therefore, additively manufacturing third heat exchanger 42 eliminates locations for potential leakage. Further, additively manufacturing third heat exchanger 42 allows channels 42C to be complex shapes to create localized turbulences to optimize heat transfer and cooling of MFA 26.

In operation, fuel from fuel tank 14 is pumped using fluid pump 16 to FCMFA 10 through tubes. The cool fuel reaches a manifold (not shown) where the fuel is split into individual tubes that are attached to each of first inlet 38A, second inlet 40A, and third inlet 42A. The fuel flows into each of first inlet 38A, second inlet 40A, and third inlet 42A and into each of first heat exchanger 38, second heat exchanger 40, and third heat exchanger 42, respectively. The fuel then flows through the plurality of channels 38C, 40C, and 42C and absorbs heat produced by MFA 26, heating the fuel. The heated fuel then dispenses from each of first heat exchanger 38, second heat exchanger 40, and third heat exchanger 42 through first outlet 38B, second outlet 40B, and third outlet 42B, respectively. The dispensed heated fuel reaches a second manifold (not shown) where the fuel is combined back into a single tube that allows the fuel to flow to engine 18 where the fuel is combusted. When the fuel is flowing through each of the heat exchangers the fuel remains separated and un-mixed. The fuel is only mixed again after it is dispensed from the heat exchangers. The fuel removes heat from MFA 26 and cools MFA 26 more than could be achieved by using air as the cooling fluid. The use of multiple heat exchangers increases the heat transfer between MFA 26 and therefore increases the cooling of MFA 26. Cooling of MFA 26 is key to the success of the system because a cooled MFA 26 has improved performance and reliability. While the described configuration places the heat exchangers such they the flow through them is parallel, other embodiments in which the flow through the heat exchangers is in series or a hybrid of series and parallel flow, may be utilized to meet system pressure and/or flow rate requirements.

Figure 4A:
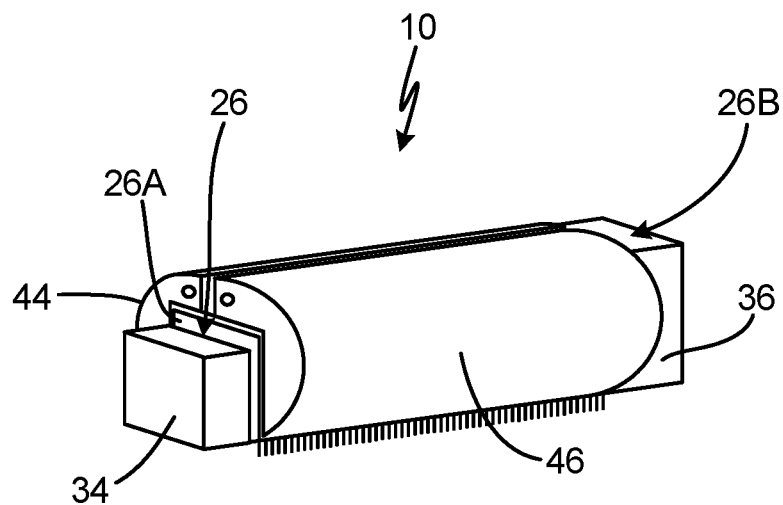
FIG. 4A is a perspective view of a second embodiment of the fuel-cooled multi-function aperture.
Figure 4B:
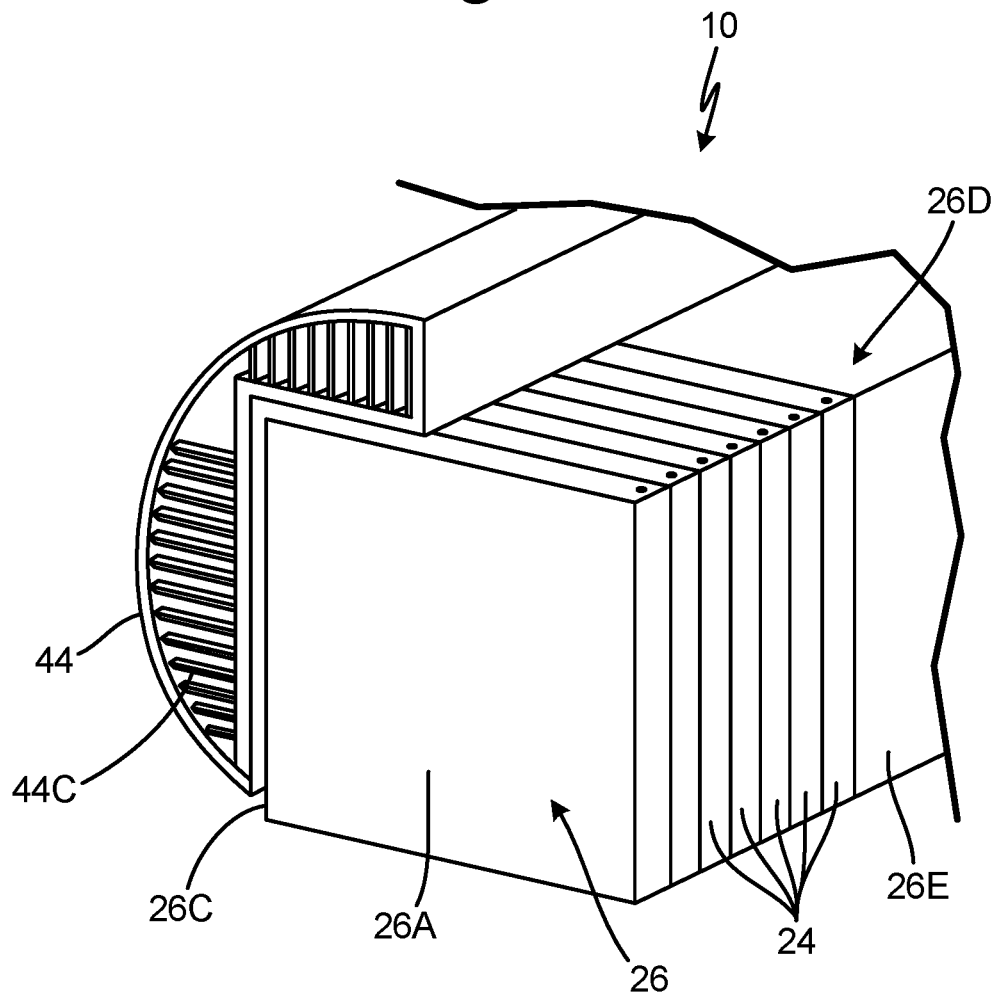
FIG. 4B is a close-up perspective view of a second embodiment of the fuel-cooled multi-function aperture.
Figure 4C:
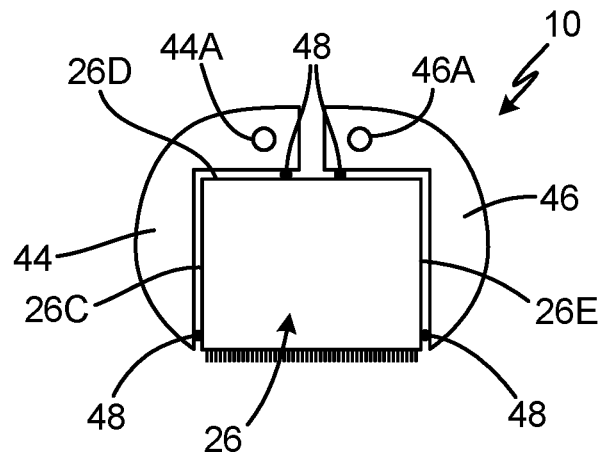
FIG. 4C is a side view of a second embodiment of the fuel-cooled multi-function aperture.
Figure 4D:
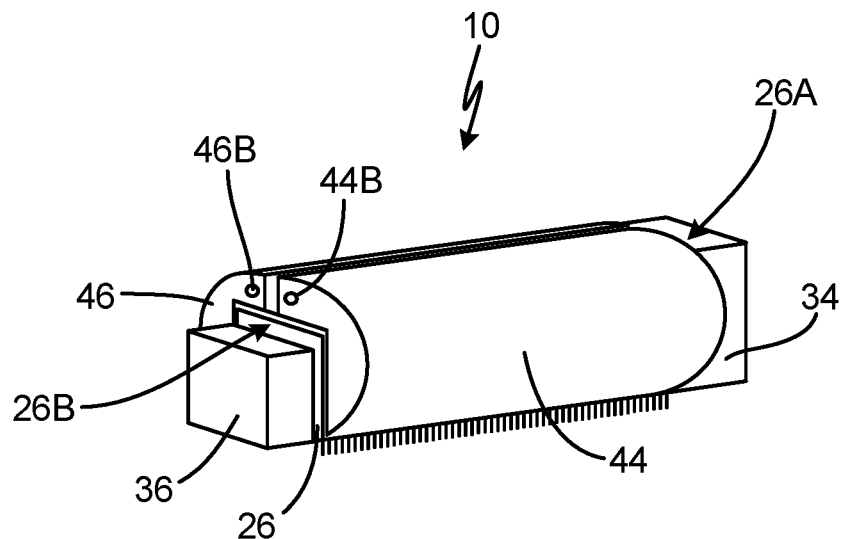
FIG. 4D is a perspective view of a second embodiment of the fuel-cooled multi-function aperture, opposite FIG. 4A.

FIG. 4A is a perspective view of a second embodiment of FCMFA 10. FIG. 4B is a close-up perspective view of the second embodiment of FCMFA 10 with first control circuit 34 removed for clarity. FIG. 4C is a side view of the second embodiment of FCMFA 10. FIG. 4D is a perspective view of a second embodiment of FCMFA 10, opposite FIG. 4A. FIGS. 4A-4D will be discussed together. FCMFA 10 includes MFA 26, first L-shaped heat exchanger 44 and second L-shaped heat exchanger 46. First L-shaped heat exchanger 44 is positioned on first side 26C of MFA 26 and wraps around to a second side 26D of MFA 26 where first L-shaped heat exchanger 44 partially covers the second side 26D of MFA 26. Second L-shaped heat exchanger 46 is positioned on third side 26E of MFA 26 and wraps around to the second side 26D of MFA 26 where second L-shaped heat exchanger 46 partially covers the second side 26D of MFA 26.

First L-shaped heat exchanger 44 includes inlet 44A positioned at first end 26A of MFA 26, outlet 44B positioned at second end 26B of MFA 26, and a plurality of channels 44C extending between inlet 44A and outlet 44B. As best shown in FIG. 4C, the outer profile of first L-shaped heat exchanger 44 is a generally arcuate shape with an outer diameter of ten inches or less. First L-shaped heat exchanger 44 is a fluidly sealed component with an outer cover and a plurality of channels 44C extending within the sealed outer cover. Each end of first L-shaped heat exchanger 44 includes a fluidly sealed cover with the exception of inlet 44A and outlet 44B. Inlet 44A can be an aperture with a fluid tight fitting suitable for transferring a liquid without leakage. Outlet 44B can be an aperture with a fluid tight fitting suitable for transferring a liquid without leakage. Although inlet 44A and outlet 44B are shown in a specific location, inlet 44A and outlet 44B can be positioned anywhere on the ends of first L-shaped heat exchanger 44.

Channels 44C are made up of a plurality of walls that create individual passages in which liquid can flow through. Channels 44C are configured to create additional surface area in which the maximum amount of heat can be removed from MFA 26. In operation, liquid (e.g. fuel) flows through channels 44C and heat produced by MFA 26 is absorbed by the liquid flowing through channels 44C, removing the heat from MFA 26. In the embodiment shown, a specific number of channels 44C are shown but in another embodiment any number of channels 44C can be used. Further, in the embodiment shown the channels 44C are straight channels. In another embodiment, channels 44C can be any shape that would maximize the surface area and amount of heat that can be removed from MFA 26. First L-shaped heat exchanger 44 is configured to receive fuel from fuel tank 14 (FIG. 1) through inlet 44A, flow the fuel through the plurality of channels 44C, and then dispense the fuel through outlet 44B into a tube that delivers the fuel to engine 18. The fuel that flows through channels 44C absorbs heat produced by MFA 26 and removes the heat from MFA 26, cooling MFA 26 in the process.

First L-shaped heat exchanger 44 is attached to each and every one of the plurality of circuit card modules 24 through fastener 48 on first side 26C and second side 26D of MFA 26. Attaching first L-shaped heat exchanger 44 to each circuit card module 24 secures circuit card module 24 in an assembled form creating MFA 26 and also enhances heat transfer from MFA 26 to first L-shaped heat exchanger 44. First L-shaped heat exchanger 44 can be a single-piece construction that is manufactured using additive manufacturing technology. First L-shaped heat exchanger 44 can be constructed from a steel, aluminum, titanium, metal alloy, or a polymer. Additively manufacturing first L-shaped heat exchanger 44 provides the benefit of allowing first L-shaped heat exchanger 44 to be a single-piece construction, eliminating abutting components that would require additional sealing components. Therefore, additively manufacturing first L-shaped heat exchanger 44 eliminates locations for potential leakage. Further, additively manufacturing first L-shaped heat exchanger 44 allows channels 44C to be complex shapes to create localized turbulences to optimize heat transfer and cooling of MFA 26.

Second L-shaped heat exchanger 46 includes inlet 46A positioned at first end 26A of MFA 26, outlet 46B positioned at second end 26B of MFA 26, and a plurality of channels 46C extending between inlet 46A and outlet 46B. As best shown in FIG. 4C, the outer profile of second L-shaped heat exchanger 46 is a generally arcuate shape with an outer diameter of ten inches or less. Second L-shaped heat exchanger 46 is a fluidly sealed component with an outer cover and a plurality of channels 46C extending within the sealed outer cover. Each end of second L-shaped heat exchanger 46 includes a fluidly sealed cover with the exception of inlet 46A and outlet 46B. Inlet 46A can be an aperture with a fluid tight fitting suitable for transferring a liquid without leakage. Outlet 46B can be an aperture with a fluid tight fitting suitable for transferring a liquid without leakage. Although inlet 46A and outlet 46B are shown in a specific location, inlet 46A and outlet 46B can be positioned anywhere on the ends of second L-shaped heat exchanger 46.

Channels 46C are made up of a plurality of walls that create individual passages in which liquid can flow through. Channels 46C are configured to create additional surface area in which the maximum amount of heat can be removed from MFA 26. In operation, liquid (e.g. fuel) flows through channels 46C and heat produced by MFA 26 is absorbed by the liquid flowing through channels 46C, removing the heat from MFA 26. In the embodiment shown, a specific number of channels 46C are shown but in another embodiment any number of channels 46C can be used. Further, in the embodiment shown the channels 46C are straight channels. In another embodiment, channels 46C can be any shape that would maximize the surface area and amount of heat that can be removed from MFA 26. Second L-shaped heat exchanger 46 is configured to receive fuel from fuel tank 14 (FIG. 1) through inlet 46A, flow the fuel through the plurality of channels 46C, and then dispense the fuel through outlet 46B into a tube that delivers the fuel to engine 18. The fuel that flows through channels 46C absorbs heat produced by MFA 26 and removes the heat from MFA 26, cooling MFA 26 in the process.

Second L-shaped heat exchanger 46 is attached to each and every one of the plurality of circuit card modules 24 through fastener 48 on second side 26D and third side 26E of MFA 26. Attaching second L-shaped heat exchanger 46 to each circuit card module 24 secures circuit card module 24 in an assembled form creating MFA 26 and also enhances heat transfer from MFA 26 to second L-shaped heat exchanger 46. Second L-shaped heat exchanger 46 can be a single-piece construction that is manufactured using additive manufacturing technology. Second L-shaped heat exchanger 46 can be constructed from a steel, aluminum, titanium, metal alloy, or a polymer. Additively manufacturing second L-shaped heat exchanger 46 provides the benefit of allowing second L-shaped heat exchanger 46 to be a single-piece construction, eliminating abutting components that would require additional sealing components. Therefore, additively manufacturing second L-shaped heat exchanger 46 eliminates locations for potential leakage. Further, additively manufacturing second L-shaped heat exchanger 46 allows channels 46C to be complex shapes to create localized turbulences to optimize heat transfer and cooling of MFA 26.

In operation, fuel from fuel tank 14 is pumped using fluid pump 16 to FCMFA 10 through tubes. The cool fuel reaches a manifold (not shown) where the fuel is split into individual tubes that are attached to each of inlet 44A and inlet 46A. The fuel flows into each of inlet 44A and inlet 46A and into each of first L-shaped heat exchanger 44 and second L-shaped heat exchanger 46, respectively. The fuel then flows through the plurality of channels 44C and 46C and absorbs heat produced by MFA 26, heating the fuel. The heated fuel then dispenses from each of first L-shaped heat exchanger 44 and second L-shaped heat exchanger 46 through outlet 44B and outlet 46B, respectively. The dispensed heated fuel reaches a second manifold (not shown) where the fuel is combined back into a single tube that allows the fuel to flow to engine 18 where the fuel is combusted. When the fuel is flowing through each of the heat exchangers the fuel remains separated and un-mixed. The fuel is only mixed again after it is dispensed from the heat exchangers. The fuel removes heat from MFA 26 and cools MFA 26 more than could be achieved by using air as the cooling fluid. The use of multiple heat exchangers increases the heat transfer between MFA 26 and therefore increases the cooling of MFA 26. Cooling of MFA 26 is key to the success of the system because a cooled MFA 26 has improved performance and reliability.

Discussion of Possible Embodiments

The following are non-exclusive descriptions of possible embodiments of the present invention.

A fuel-cooled multi-function aperture comprising a multi-function aperture comprising a plurality of circuit card modules, wherein each of the plurality of circuit card modules is positioned adjacent to at least one of the plurality of circuit card modules in a stacked configuration; and at least one heat exchanger attached to and positioned adjacent to the multi-function aperture; wherein the at least one heat exchanger comprises an inlet, an outlet, and a plurality of channels extending between the inlet and the outlet; and wherein the at least one heat exchanger is configured to receive fuel through the inlet, flow the fuel through the plurality of channels, and dispense the fuel through the outlet.

The fuel-cooled multi-function aperture of the preceding paragraph can optionally include, additionally and/or alternatively, any one or more of the following features, configurations and/or additional components:

In any of the foregoing fuel-cooled multi-function embodiments, the fuel-cooled multi-function may additionally or alternatively include a first heat exchanger positioned on a first side of the multi-function aperture, wherein the first heat exchanger includes a first inlet positioned at a first end of the multi-function aperture and a first outlet positioned at a second end of the multi-function aperture; a second heat exchanger positioned on a second side of the multi-function aperture, wherein the second heat exchanger includes a second inlet positioned at the first end of the multi-function aperture and a second outlet positioned at the second end of the multi-function aperture; and a third heat exchanger positioned on a third side of the multi-function aperture, wherein the third heat exchanger includes a third inlet positioned at the first end of the multi-function aperture and a third outlet positioned at the second end of the multi-function aperture.

In any of the foregoing fuel-cooled multi-function embodiments, the fuel-cooled multi-function may additionally or alternatively include the first heat exchanger is attached to each and every one of the plurality of circuit card modules through a fastener on the first side of the multi-function aperture; the second heat exchanger is attached to each and every one of the plurality of circuit card modules through a fastener on the second side of the multi-function aperture; and the third heat exchanger is attached to each and every one of the plurality of circuit card modules through a fastener on the third side of the multi-function aperture.

In any of the foregoing fuel-cooled multi-function embodiments, the fuel-cooled multi-function may additionally or alternatively include fuel enters through the first inlet, flows through the plurality of channels, and dispenses through the first outlet, and wherein the first inlet, plurality of channels, and the first outlet define a first flow path; fuel enters through the second inlet, flows through the plurality of channels, and dispenses through the second outlet, and wherein the second inlet, plurality of channels, and the second outlet define a second flow path; fuel enters through the third inlet, flows through the plurality of channels, and dispenses through the third outlet, and wherein the third inlet, plurality of channels, and the third outlet define a third flow path; and wherein the plurality of channels of each of the first heat exchanger, second heat exchanger, and third heat exchanger remain separate from each other so that the fuel in each of the first heat exchanger, second heat exchanger, and third heat exchanger do not mix.

In any of the foregoing fuel-cooled multi-function embodiments, the fuel-cooled multi-function may additionally or alternatively include the profile of the first heat exchanger is a semi-circle with an outer diameter of ten inches or less; the profile of the second heat exchanger is a semi-circle with an outer diameter of ten inches or less; and the profile of the third heat exchanger is a semi-circle with an outer diameter of ten inches or less.

In any of the foregoing fuel-cooled multi-function embodiments, the fuel-cooled multi-function may additionally or alternatively include a first L-shaped heat exchanger positioned on a first side of the multi-function aperture and wrapping around to a second side of the multi-function aperture, wherein the first L-shaped heat exchanger includes an inlet positioned at a first end of the multi-function aperture and an outlet positioned at a second end of the multi-function aperture; and a second L-shaped heat exchanger positioned on a third side of the multi-function aperture and wrapping around to the second side of the multi-function aperture, wherein the second L-shaped heat exchanger includes an inlet positioned at the first end of the multi-function aperture and an outlet positioned at the second end of the multi-function aperture.

In any of the foregoing fuel-cooled multi-function embodiments, the fuel-cooled multi-function may additionally or alternatively include the first L-shaped heat exchanger is attached to each and every one of the plurality of circuit card modules through a fastener on at least one side of the multi-function aperture; and the second L-shaped heat exchanger is attached to each and every one of the plurality of circuit card modules through a fastener on at least one side of the multi-function aperture.

In any of the foregoing fuel-cooled multi-function embodiments, the fuel-cooled multi-function may additionally or alternatively include fuel enters through the inlet of the first L-shaped heat exchanger, flows through the plurality of channels, and dispenses through the outlet of the first L-shaped heat exchanger, and wherein the inlet, plurality of channels, and the outlet of the first L-shaped heat exchanger define a first L-shaped flow path; fuel enters through the inlet of the second L-shaped heat exchanger, flows through the plurality of channels, and dispenses through the outlet of the second L-shaped heat exchanger, and wherein the inlet, plurality of channels, and the outlet of the first L-shaped heat exchanger define a second L-shaped flow path; and wherein the plurality of channels of the first L-shaped heat exchanger and the second L-shaped heat exchanger remain separate from each other so that the fuel in the first L-shaped heat exchanger and the second L-shaped heat exchanger do not mix.

In any of the foregoing fuel-cooled multi-function embodiments, the fuel-cooled multi-function may additionally or alternatively include the outer diameter of the first L-shaped heat exchanger is ten inches or less; and the outer diameter of the second L-shaped heat exchanger is ten inches or less.

In any of the foregoing fuel-cooled multi-function embodiments, the fuel-cooled multi-function may additionally or alternatively include a first control circuit positioned adjacent to one of the plurality of circuit card modules at a first end of the multi-function aperture; and a second control circuit positioned adjacent to one of the plurality of circuit card modules at a second end of the multi-function aperture.

In any of the foregoing fuel-cooled multi-function embodiments, the fuel-cooled multi-function may additionally or alternatively include a first circuit card attached to a first side of a rib; and a second circuit card attached to a second side of the rib, opposite the first side of the rib; wherein the rib is positioned between the first circuit card and the second circuit card.

In any of the foregoing fuel-cooled multi-function embodiments, the fuel-cooled multi-function may additionally or alternatively include the first circuit card includes eight electrical pins extending from one side of the first circuit card; and the second circuit card includes eight electrical pins extending from one side of the second circuit card; wherein the pins of the first circuit card and the second circuit card are parallel when installed on the rib positioned between the first circuit card and the second circuit card.

In any of the foregoing fuel-cooled multi-function embodiments, the fuel-cooled multi-function may additionally or alternatively include the at least one heat exchanger can be constructed from one of an aluminum, a steel, a titanium, a metal alloy, or a polymer.

In any of the foregoing fuel-cooled multi-function embodiments, the fuel-cooled multi-function may additionally or alternatively include the at least one heat exchanger is manufactured using additive manufacturing technology as a single piece construction; and wherein if there are more than one heat exchanger, each of the heat exchangers are manufactured separately using additive manufacturing technology as a separate single piece construction.

In any of the foregoing fuel-cooled multi-function embodiments, the fuel-cooled multi-function may additionally or alternatively include the fuel is a liquid fuel capable of combustion in an internal combustion engine or a gas turbine engine.

In any of the foregoing fuel-cooled multi-function embodiments, the fuel-cooled multi-function may additionally or alternatively include a fluid pump forces the fuel to flow from a fuel tank to the inlet of the at least one heat exchanger.

In any of the foregoing fuel-cooled multi-function embodiments, the fuel-cooled multi-function may additionally or alternatively include the fuel flowing through the plurality of channels absorbs and removes heat from the multi-function aperture.

In any of the foregoing fuel-cooled multi-function embodiments, the fuel-cooled multi-function may additionally or alternatively include the heated fuel dispensing from the outlet of the at least one heat exchanger flows to an internal combustion engine or a gas turbine engine where the fuel is combusted.

In any of the foregoing fuel-cooled multi-function embodiments, the fuel-cooled multi-function may additionally or alternatively include each of the plurality of circuit card modules is configured to transmit and receive radar, communication, and other signals; and the multi-function aperture is a phased array antenna configured to transmit and receive a plurality of radar, communication, and other signals.

In any of the foregoing fuel-cooled multi-function embodiments, the fuel-cooled multi-function may additionally or alternatively include transferring fuel from a fuel tank to the multi-function aperture; flowing the fuel through at least one heat exchanger attached and positioned adjacent to the multi-function aperture; removing heat from the multi-function aperture as the fuel flows through the at least one heat exchanger; and transferring the fuel to an engine for combustion by the engine.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A fuel-cooled multi-function aperture comprising:
 a multi-function aperture comprising:
  a plurality of circuit card modules, wherein each of the plurality of circuit card modules is positioned adjacent to at least one of the plurality of circuit card modules in a stacked configuration; and
 at least one heat exchanger attached to the multi-function aperture;
 wherein the at least one heat exchanger comprises an inlet, an outlet, and a plurality of channels extending between the inlet and the outlet;
 wherein the at least one heat exchanger is configured to receive fuel through the inlet, flow the fuel through the plurality of channels, and dispense the fuel through the outlet; and
 wherein the at least one heat exchanger further comprises:
  a first heat exchanger positioned on a first side of the multi-function aperture, wherein the first heat exchanger includes a first inlet positioned at a first end of the multi-function aperture and a first outlet positioned at a second end of the multi-function aperture;
  a second heat exchanger positioned on a second side of the multi-function aperture, wherein the second heat exchanger includes a second inlet positioned at the first end of the multi-function aperture and a second outlet positioned at the second end of the multi-function aperture; and
  a third heat exchanger positioned on a third side of the multi-function aperture, wherein the third heat exchanger includes a third inlet positioned at the first end of the multi-function aperture and a third outlet positioned at the second end of the multi-function aperture.

2. The fuel-cooled multi-function aperture of claim 1, wherein:
 the first heat exchanger is attached to each of the plurality of circuit card modules through a fastener on the first side of the multi-function aperture;
 the second heat exchanger is attached to each of the plurality of circuit card modules through a fastener on the second side of the multi-function aperture; and
 the third heat exchanger is attached to each of the plurality of circuit card modules through a fastener on the third side of the multi-function aperture.

3. The fuel-cooled multi-function aperture of claim 1, wherein:
 fuel enters through the first inlet, flows through the plurality of channels, and dispenses through the first outlet, and wherein the first inlet, plurality of channels, and the first outlet define a first flow path;
 fuel enters through the second inlet, flows through the plurality of channels, and dispenses through the second outlet, and wherein the second inlet, plurality of channels, and the second outlet define a second flow path;
 fuel enters through the third inlet, flows through the plurality of channels, and dispenses through the third outlet, and wherein the third inlet, plurality of channels, and the third outlet define a third flow path; and
 wherein the plurality of channels of each of the first heat exchanger, second heat exchanger, and third heat exchanger remain separate from each other so that the fuel in each of the first heat exchanger, second heat exchanger, and third heat exchanger do not mix.

4. The fuel-cooled multi-function aperture of claim 1, wherein:
 the profile of the first heat exchanger is a semi-circle with an outer diameter of ten inches or less;
 the profile of the second heat exchanger is a semi-circle with an outer diameter of ten inches or less; and
 the profile of the third heat exchanger is a semi-circle with an outer diameter of ten inches or less.

5. The fuel-cooled multi-function aperture of claim 1, wherein the at least one heat exchanger comprises:
 a first L-shaped heat exchanger positioned on a first side of the multi-function aperture and wrapping around to a second side of the multi-function aperture, wherein the first L-shaped heat exchanger includes an inlet positioned at a first end of the multi-function aperture and an outlet positioned at a second end of the multi-function aperture; and
 a second L-shaped heat exchanger positioned on a third side of the multi-function aperture and wrapping around to the second side of the multi-function aperture, wherein the second L-shaped heat exchanger includes an inlet positioned at the first end of the multi-function aperture and an outlet positioned at the second end of the multi-function aperture.

6. The fuel-cooled multi-function aperture of claim 5, wherein:
 the first L-shaped heat exchanger is attached to each of the plurality of circuit card modules through a fastener on at least one side of the multi-function aperture; and
 the second L-shaped heat exchanger is attached to each of the plurality of circuit card modules through a fastener on at least one side of the multi-function aperture.

7. The fuel-cooled multi-function aperture of claim 5, wherein:
 fuel enters through the inlet of the first L-shaped heat exchanger, flows through the plurality of channels, and dispenses through the outlet of the first L-shaped heat exchanger, and wherein the inlet, plurality of channels, and the outlet of the first L-shaped heat exchanger define a first L-shaped flow path;
 fuel enters through the inlet of the second L-shaped heat exchanger, flows through the plurality of channels, and dispenses through the outlet of the second L-shaped heat exchanger, and wherein the inlet, plurality of channels, and the outlet of the first L-shaped heat exchanger define a second L-shaped flow path; and
 wherein the plurality of channels of the first L-shaped heat exchanger and the second L-shaped heat exchanger remain separate from each other so that the fuel in the first L-shaped heat exchanger and the second L-shaped heat exchanger do not mix.

8. The fuel-cooled multi-function aperture of claim 5, wherein:
 the outer diameter of the first L-shaped heat exchanger is ten inches or less; and the outer diameter of the second L-shaped heat exchanger is ten inches or less.

9. The fuel-cooled multi-function aperture of claim 1, wherein the multi-function aperture further comprises:
   a first control circuit positioned adjacent to one of the plurality of circuit card modules at a first end of the multi-function aperture; and
   a second control circuit positioned adjacent to one of the plurality of circuit card modules at a second end of the multi-function aperture.

10. The fuel-cooled multi-function aperture of claim 1, wherein each of the circuit card modules comprises:
    a first circuit card attached to a first side of a rib; and
    a second circuit card attached to a second side of the rib, opposite the first side of the rib;
    wherein the rib is positioned between the first circuit card and the second circuit card.

11. The fuel-cooled multi-function aperture of claim 10, wherein:
    the first circuit card includes eight electrical pins extending from one side of the first circuit card; and
    the second circuit card includes eight electrical pins extending from one side of the second circuit card;
    wherein the pins of the first circuit card and the second circuit card are parallel when installed on the rib positioned between the first circuit card and the second circuit card.

12. The fuel-cooled multi-function aperture of claim 1, wherein the at least one heat exchanger can be constructed from one of an aluminum, a steel, a titanium, a metal alloy, or a polymer.

13. The fuel-cooled multi-function aperture of claim 1, wherein:
    the at least one heat exchanger is manufactured using additive manufacturing technology as a single piece construction; and
    wherein if there are more than one heat exchanger, each of the heat exchangers are manufactured separately using additive manufacturing technology as a separate single piece construction.

14. The fuel-cooled multi-function aperture of claim 1, wherein the fuel is a liquid fuel capable of combustion in an internal combustion engine or a gas turbine engine.

15. The fuel-cooled multi-function aperture of claim 1, wherein a fluid pump forces the fuel to flow from a fuel tank to the inlet of the at least one heat exchanger.

16. The fuel-cooled multi-function aperture of claim 1, wherein the fuel flowing through the plurality of channels removes heat from the multi-function aperture.

17. The fuel-cooled multi-function aperture of claim 16, wherein the heated fuel dispensing from the outlet of the at least one heat exchanger flows to an internal combustion engine or a gas turbine engine where the fuel is combusted.

18. The fuel-cooled multi-function aperture of claim 1, wherein:
    each of the plurality of circuit card modules is configured to transmit and receive radar, communication, and other signals; and
    the multi-function aperture is a phased array antenna configured to transmit and receive a plurality of radar, communication, and other signals.

19. A method of cooling a multi-function aperture, the method comprising:
    flowing fuel from a fuel tank to the multi-function aperture;
    flowing the fuel through at least one heat exchanger attached and positioned adjacent to the multi-function aperture;
    removing heat from the multi-function aperture as the fuel flows through the at least one heat exchanger; and
    transferring the fuel to an engine for combustion by the engine
    wherein the at least one heat exchanger further comprises:
        a first heat exchanger positioned on a first side of the multi-function aperture, wherein the first heat exchanger includes a first inlet positioned at a first end of the multi-function aperture and a first outlet positioned at a second end of the multi-function aperture;
        a second heat exchanger positioned on a second side of the multi-function aperture, wherein the second heat exchanger includes a second inlet positioned at the first end of the multi-function aperture and a second outlet positioned at the second end of the multi-function aperture; and
        a third heat exchanger positioned on a third side of the multi-function aperture, wherein the third heat exchanger includes a third inlet positioned at the first end of the multi-function aperture and a third outlet positioned at the second end of the multi-function aperture.

* * * * *